United States Patent
Wares

(10) Patent No.: US 8,258,395 B2
(45) Date of Patent: Sep. 4, 2012

(54) PHOTOVOLTAIC MODULE AND INTERLOCKED STACK OF PHOTOVOLTAIC MODULES

(75) Inventor: Brian S. Wares, Sacramento, CA (US)

(73) Assignee: SunPower Corporation, San Jose, CA (US)

(*) Notice: Subject to any disclaimer, the term of this patent is extended or adjusted under 35 U.S.C. 154(b) by 648 days.

(21) Appl. No.: 12/392,076

(22) Filed: Feb. 24, 2009

(65) Prior Publication Data
US 2010/0212722 A1 Aug. 26, 2010

(51) Int. Cl.
*H01L 31/042* (2006.01)
*H01L 31/048* (2006.01)
*H01L 31/04* (2006.01)

(52) U.S. Cl. ........................ 136/251; 136/243

(58) Field of Classification Search .................. None
See application file for complete search history.

(56) References Cited

U.S. PATENT DOCUMENTS

| | | | |
|---|---|---|---|
| 1,749,547 A | 3/1930 | Ruddy | |
| 4,101,101 A * | 7/1978 | Barkats et al. | 244/172.7 |
| 4,392,009 A | 7/1983 | Napoli | |
| 4,498,822 A * | 2/1985 | Diba | 410/2 |
| 4,636,577 A | 1/1987 | Peterpaul | |
| 4,752,168 A | 6/1988 | Richter | |
| 5,476,553 A * | 12/1995 | Hanoka et al. | 136/251 |
| 5,677,830 A * | 10/1997 | Nogas et al. | 361/790 |
| 6,410,843 B1 | 6/2002 | Kishi et al. | |
| 6,506,970 B2 * | 1/2003 | Yamawaki | 136/251 |
| D555,083 S | 11/2007 | Sharma et al. | |
| 7,297,866 B2 | 11/2007 | Aschenbrenner | |
| D560,605 S | 1/2008 | McClintock et al. | |
| 7,406,800 B2 * | 8/2008 | Cinnamon et al. | 52/173.3 |
| 7,487,771 B1 * | 2/2009 | Eiffert et al. | 126/622 |
| 7,832,157 B2 * | 11/2010 | Cinnamon | 52/173.3 |
| 8,065,844 B2 * | 11/2011 | Botkin et al. | 52/173.3 |
| 2003/0094022 A1 * | 5/2003 | Tan | 70/58 |
| 2004/0016455 A1 * | 1/2004 | Oogami | 136/244 |
| 2004/0043528 A1 | 3/2004 | Kruhler | |
| 2004/0050414 A1 * | 3/2004 | Oogami | 136/249 |
| 2006/0005875 A1 * | 1/2006 | Haberlein | 136/251 |
| 2007/0295392 A1 * | 12/2007 | Cinnamon | 136/251 |
| 2008/0163918 A1 * | 7/2008 | Li | 136/244 |
| 2009/0165843 A1 | 7/2009 | Horioka et al. | |

FOREIGN PATENT DOCUMENTS

JP 2000-79961 A * 3/2000

OTHER PUBLICATIONS

International Search Report for Application No. PCT/US2010/021217, Mar. 22, 2010 (2 sheets).

* cited by examiner

*Primary Examiner* — Jennifer Michener
*Assistant Examiner* — Christopher Danicic
(74) *Attorney, Agent, or Firm* — Okamoto & Benedicto LLP

(57) ABSTRACT

One embodiment relates to an arrangement of photovoltaic modules configured for transportation. The arrangement includes a plurality of photovoltaic modules, each photovoltaic module including a frame having at least a top member and a bottom member. A plurality of alignment features are included on the top member of each frame, and a plurality of alignment features are included on the bottom member of each frame. Adjacent photovoltaic modules are interlocked by the alignment features on the top member of a lower module fitting together with the alignment features on the bottom member of an upper module. Other embodiments, features and aspects are also disclosed.

15 Claims, 8 Drawing Sheets

PHOTOVOLTAIC MODULE AND INTERLOCKED STACK OF PHOTOVOLTAIC MODULES

STATEMENT REGARDING FEDERALLY SPONSORED RESEARCH OR DEVELOPMENT

The invention described herein was made with Governmental support under contract number DE-FC36-07GO17043 awarded by the United States Department of Energy. The Government may have certain rights in the invention.

BACKGROUND OF THE INVENTION

1. Field of the Invention

The present disclosure relates to photovoltaic modules and the transportation and installation thereof.

2. Description of the Background Art

Photovoltaic cells, also known as "solar cells," are devices for converting solar radiation to electrical energy. Photovoltaic cells are typically arranged into an array and packaged as a photovoltaic (PV) module, also known as a "solar module."

Photovoltaic modules may also be installed in solar collector arrays with capacities from a few kilowatts to hundreds of kilowatts, or more. These arrays are typically installed where there is a reasonably flat area with exposure to the sun for significant portions of the day.

A substantial portion of the cost associated with solar collector arrays relates to the transportation and installation of the photovoltaic modules. Hence, it is highly desirable to improve methods and apparatus of transporting and installing photovoltaic modules.

SUMMARY

One embodiment relates to an arrangement of photovoltaic modules configured for transportation. The arrangement includes a plurality of photovoltaic modules, each photovoltaic module including a frame having at least a top member and a bottom member. A plurality of alignment features are included on the top member of each frame, and a plurality of alignment features are included on the bottom member of each frame. Adjacent photovoltaic modules are interlocked by the alignment features on the top member of a lower module fitting together with the alignment features on the bottom member of an upper module.

Another embodiment relates to a photovoltaic module. The module includes an array of solar cells and a frame for supporting the array of solar cells. The frame includes a top member and a bottom member connected by a side member. A plurality of alignment features are included on the top member, and a plurality of alignment features are included on the bottom member. The alignment features on the bottom member are configured to couple with the alignment features on the top member of another module.

Other embodiments, aspects and features are also disclosed.

DETAILED DESCRIPTION

In the present disclosure, numerous specific details are provided, such as examples of apparatus, process parameters, materials, process steps, and structures, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

Example Solar Collector Arrangements

Figure 1:
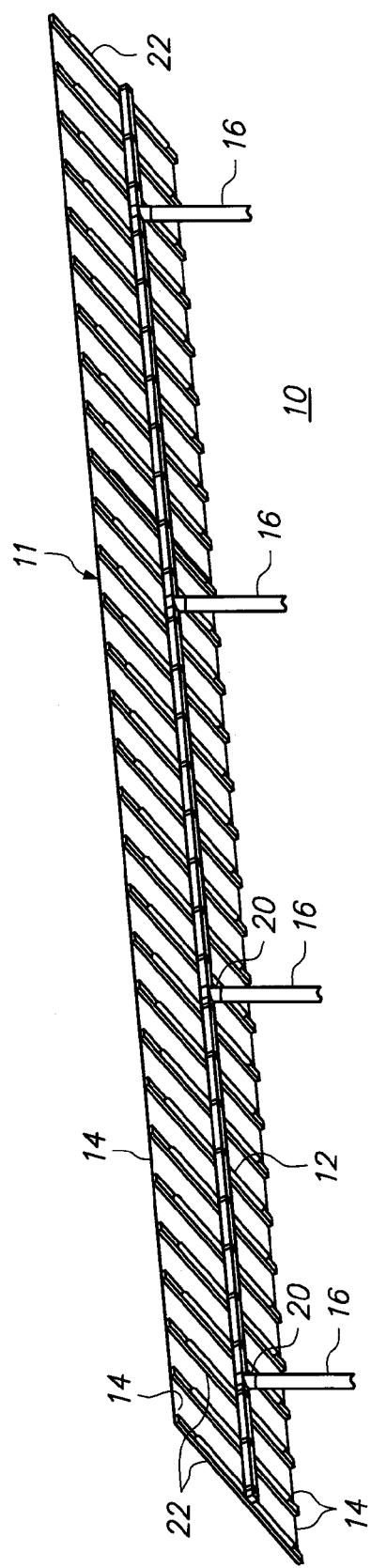
FIG. 1 depicts a first example solar collector arrangement with an array of photovoltaic modules supported by a frame structure.

FIG. 1 depicts a first example solar collector arrangement 10. In this view, a single row 11 is shown, but the array can comprise several rows 11 joined end to end, and can comprise any number of such rows side by side. A row of solar panels 14, i.e., photovoltaic modules, is attached onto a torsion tube 12.

In this example arrangement, the row has sixty panels or modules 14, i.e., thirty sets of two modules. There are four vertical pier tubes 16, which can be round or square cross section, as desired, each supported in the earth.

At a top end of each pier tube 16 may be a pier cap weldment 20, which may have a transverse square tubular sleeve that fits the profile of the torsion tube 12. The pier caps 20 on the pier tubes 16 may be aligned so that the torsion tube 12 threads through them. There may be multiple support rails or panel rails 22 attached onto the torsion tube 12, and these rails 22 may be arranged across tube at right angles to the tube axis and may be spaced apart the width of one panel or module 14.

Figure 2:
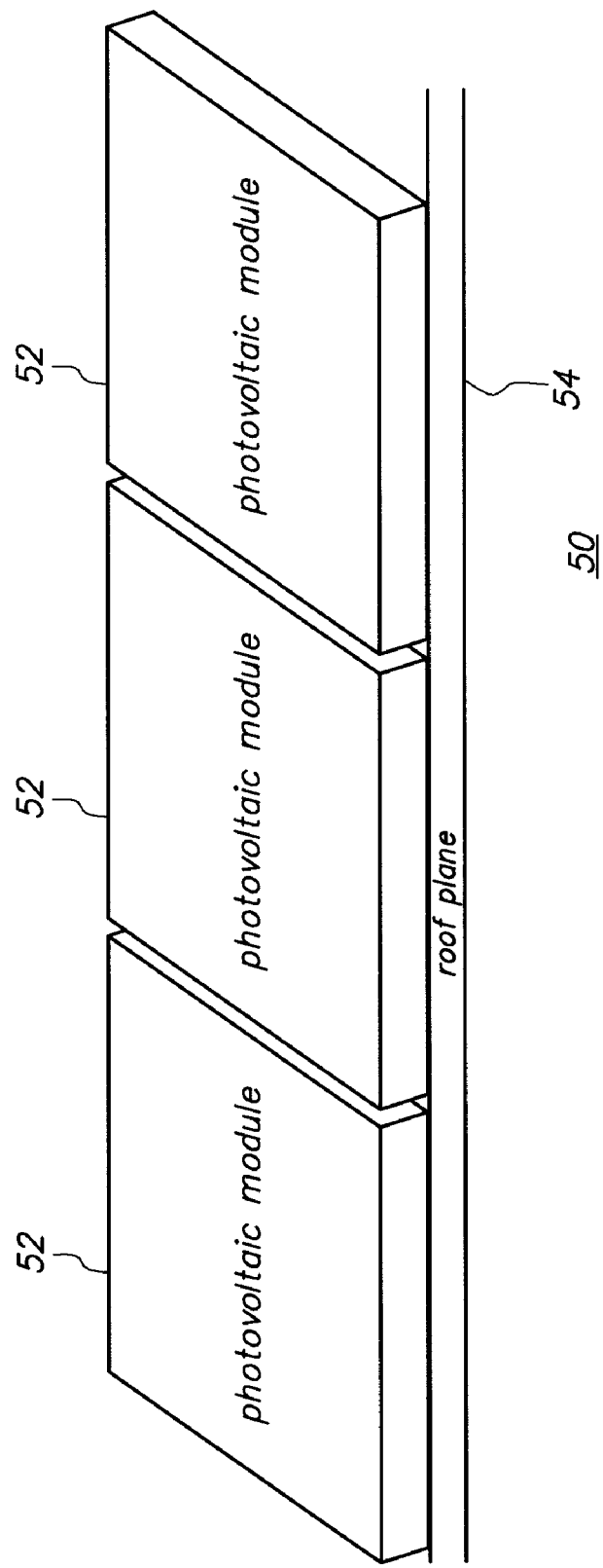
FIG. 2 depicts a second example solar collector arrangement with an array of photovoltaic modules supported by a roof.

FIG. 2 depicts a second example solar collector arrangement 50 with an array of photovoltaic modules 52 supported by a roof. As shown, the modules 52 may be installed flush or relatively close to a roof plane 54.

Conventional Packaging of Solar Modules for Shipment

Figure 3:
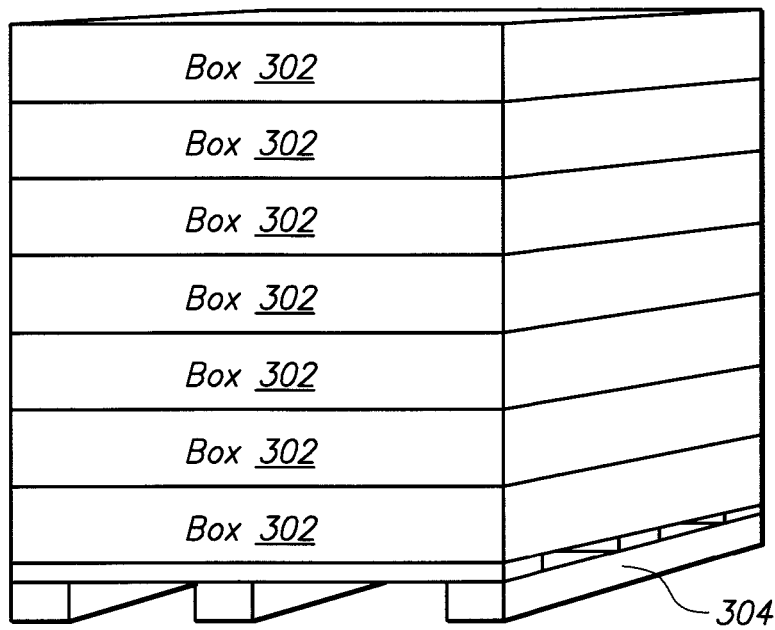
FIG. 3 depicts a first conventional packaging solution for transporting photovoltaic modules.

Photovoltaic modules are typically packed and shipped in cardboard boxes. As depicted in FIG. 3, multiple boxes 302 are generally stacked on top of each other and shipped together as a unit. The stack of boxes 302 are typically strapped to a wood pallet 304 and shipped together as a unit. Two solar modules may be included in each cardboard box with a cardboard sheet between them.

Figure 4:
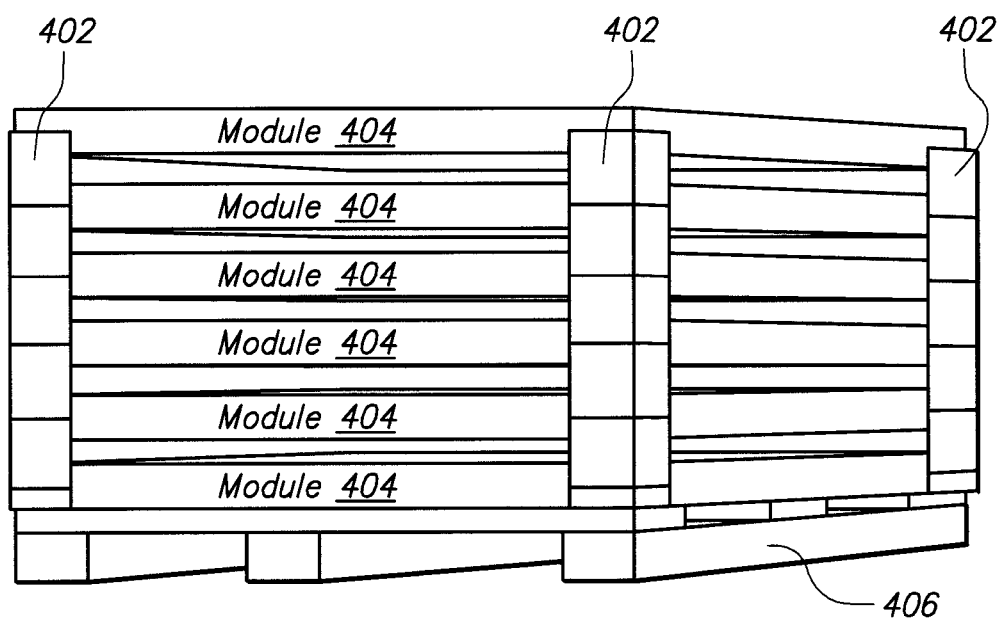
FIG. 4 depicts a second conventional packaging solution for transporting photovoltaic modules.

Another packaging solution for solar modules is depicted in FIG. 4. This solution uses corner elements 402 to support and stack multiple modules 404 on top of each other. The stack with the corner elements is then strapped to a wood pallet 406 and shipped together as a unit.

Disadvantages and Inefficiencies with Conventional Packaging Solutions

Applicants have determined that these conventional packaging solutions have disadvantages and inefficiencies.

The conventional solution of packaging the modules in cardboard boxes results in extra cost for the boxes. In addition, there is substantial work needed to unpack the modules and recycle the boxes at the installation site. For example, in a large installation, there is typically a worker dedicated to this task on unpacking and recycling boxes. Furthermore, the cardboard material takes up space in a stack of modules being shipped and so reduces the shipping density of the modules. A lower shipping density means that fewer modules may be shipped in a fixed volumetric size of a shipping container.

The packaging solution which uses corner elements results in substantial space between modules, both horizontally and vertically, in a shipping stack. Hence, this solution also results in a relatively low shipping density. Furthermore, there is also the cost of the corner elements, the need to dispose of or recycle the corner elements at the installation site, and in some cases return shipping of the corners to the manufacturer.

Efficient Packaging Solution for Transporting Solar Modules

Figure 5:
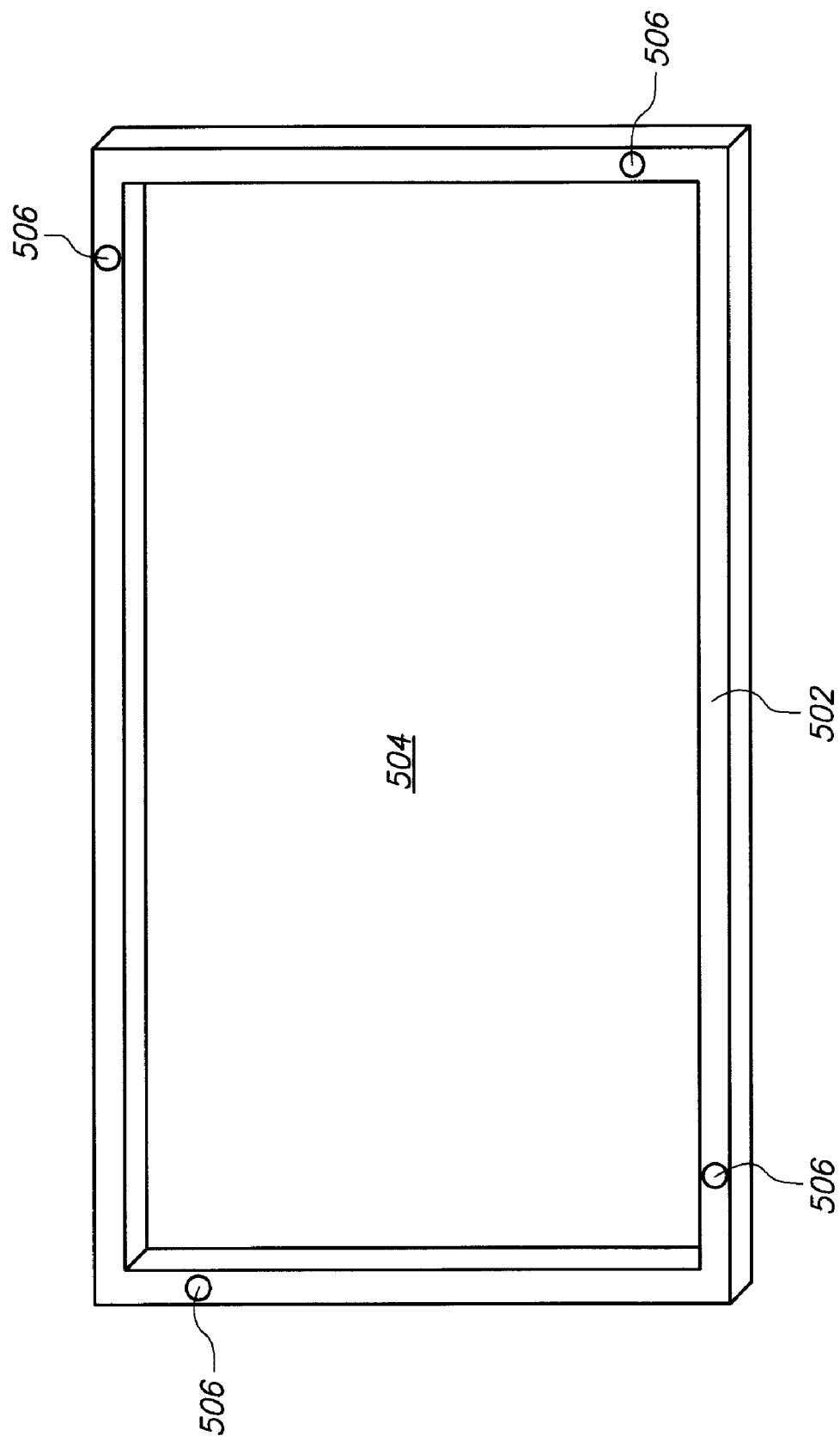
FIG. 5 depicts a frame for a photovoltaic module with a stacking feature in accordance with an embodiment of the invention.

FIG. 5 depicts (in perspective view from the top) a frame for a photovoltaic module with a stacking feature in accordance with an embodiment of the invention. Exemplary profiles for the frame are described below in relation to FIGS. 6 and 7.

As seen in FIG. 5, the module frame 502 may be a rectangular frame which is configured to frame and support a photovoltaic module. (The module is configured in the framed area 504.) In accordance with an embodiment of the present invention, the module frame includes (male) alignment features 506 which protrude from the top surface of the frame. In addition, there are corresponding holes (female alignment features) on the bottom surface of the frame. As discussed further below, these alignment features 506 enable an advantageous packaging solution for the transportation of the photovoltaic modules.

In one implementation, an alignment feature 506 may be included on each side of the top surface of the frame and positioned relatively close to a corner of the frame. Other implementations may position the alignment features 506 at different locations on the top surface of the frame.

Figure 6:
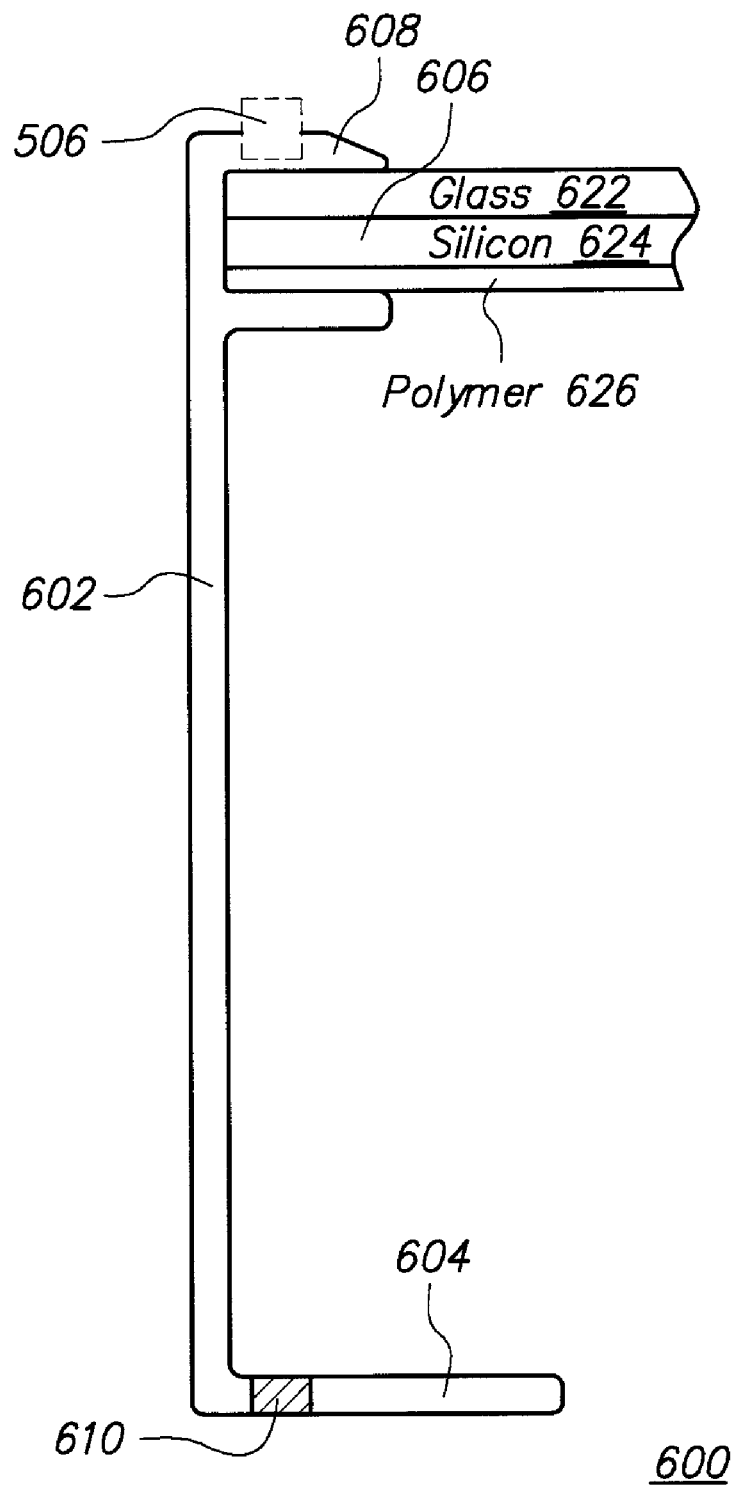
FIG. 6 shows a first profile of a module frame with an alignment feature in accordance with an embodiment of the invention.

FIG. 6 shows a first profile of a module frame with an alignment feature in accordance with an embodiment of the invention. As shown, the frame includes a side member 602 which attaches to and separates a top member 608 and a bottom member 604. A slot 606 towards the top of the frame is configured to hold and support the photovoltaic cells within the frame. (The top faces the sunlight after installation of the module.) The photovoltaic cells form a silicon layer 624 which may be sandwiched between a glass layer 622 and a polymer layer 626.

In accordance with an embodiment of the invention, male alignment features (for example, pins or raised track) 506 are included at selected positions to the top surface of the frame. The alignment features 506 may be inserted into the top surface of the frame during the frame manufacturing process. The inserted alignment features 506 preferably remain above and do not break the glass layer 622 so as to maintain the integrity of the enclosure for the silicon cells. Alternatively, the alignment features 506 may be formed during the extrusion of the frame.

Corresponding female alignment features (for example, holes or grooves) 610 are also formed in the bottom member of the frame. These female alignment features 610 are formed on the bottom area of the frame at locations which correspond to (and in case of pins and holes, coaxially align with) the locations of the male alignment features 506 on the top area of the frame. As such, with these male and female alignment features, the module frames may be directly stacked on each other in a secure and interlocked manner. In one embodiment, one or more of the corresponding holes may also function as drain holes at the bottom of the frame.

Figure 7:
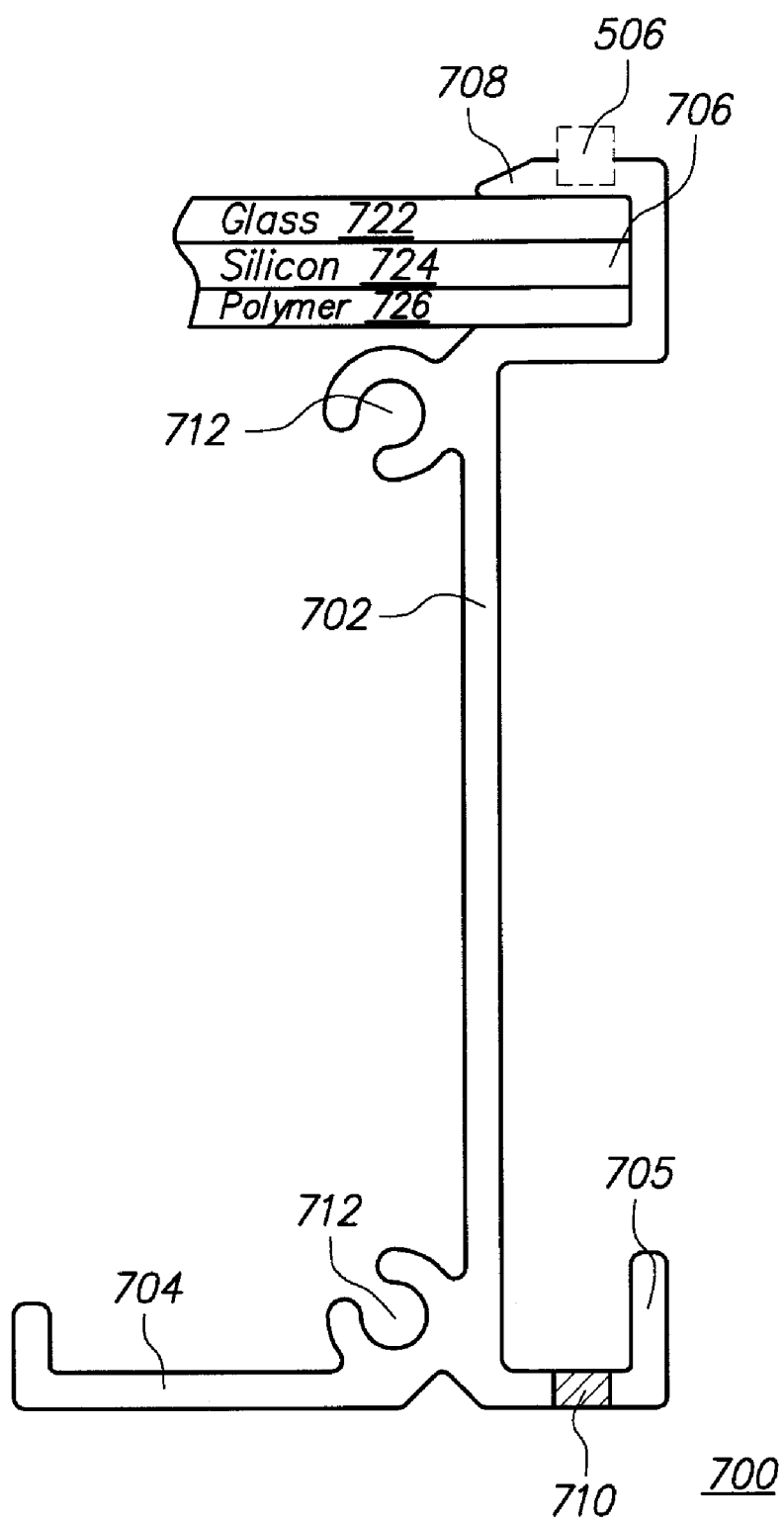
FIG. 7 shows a second profile of a module frame with an alignment feature in accordance with an embodiment of the invention.

FIG. 7 shows a second profile of a module frame with male and female alignment features in accordance with an embodiment of the invention. As shown, the frame includes a side member 702 which is coupled to a top member 708 and bottom members 704 and 705. A slot 706 towards the top of the frame is configured to hold and support the photovoltaic cells within the frame. The photovoltaic cells form a silicon layer 724 which may be sandwiched between a glass layer 722 and a polymer layer 726. Also shown are channels 712 which may be used to provide an anchor for self-tapping screws.

In accordance with an embodiment of the invention, male alignment features 506 are included at selected positions to the top surface of the frame. The male alignment features (for example, pins or raised tracks) 506 may be inserted into the top surface of the frame during the frame manufacturing process. The inserted alignment features 506 preferably remain above and do not break the glass layer 722 so as to maintain the integrity of the enclosure for the silicon cells. Alternatively, the alignment features 506 may be formed during the extrusion of the frame.

Corresponding female alignment features (for example, holes or grooves) 710 are also formed in the bottom member of the frame. These female alignment features 710 are formed on the bottom area of the frame at locations which correspond to (and in the case of pins and holes, coaxially align with) the locations of the male alignment features 506 on the top area of the frame. As such, with these male and female alignment features, the module frames may be directly stacked on each other in a secure and interlocked manner. In one embodiment, one or more of the corresponding holes may also function as drain holes at the bottom of the frame.

Figure 8:
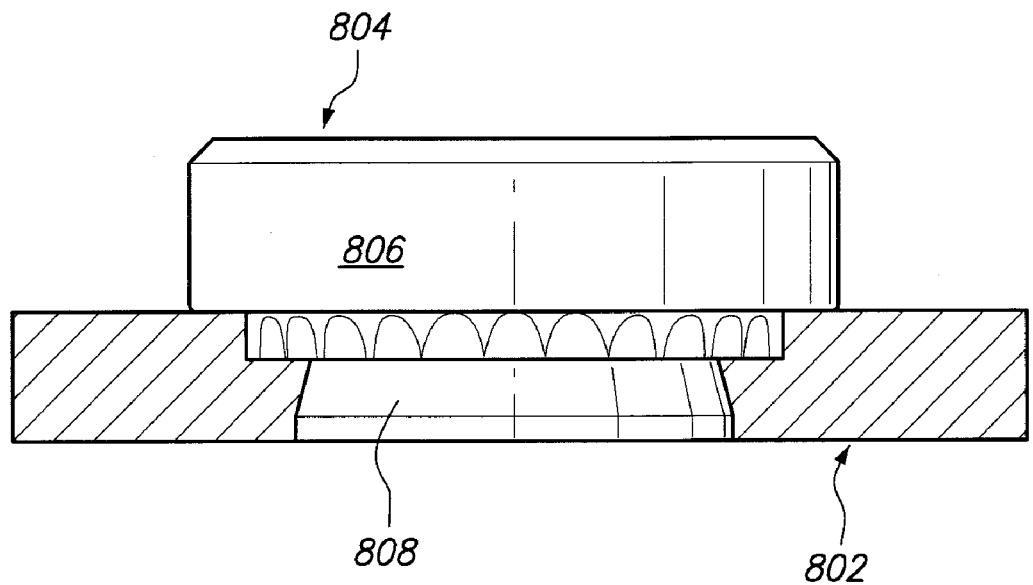
FIG. 8 depicts an exemplary alignment feature attached to a module frame in accordance with an embodiment of the invention.

FIG. 8 depicts an exemplary alignment feature 804 attached to a module frame 802 in accordance with an embodiment of the invention. As shown, this (male) alignment feature 804 may comprise a protruding portion 806 that rises above the top surface of the frame and an embedded portion 808 that secures it to the frame.

In this particular embodiment, the alignment feature 804 is implemented using a self-clinching fastener. The fastener may be installed in the top surface of the frame by drilling a hole at the location for the alignment feature and then inserting the self-clinching portion of the fastener into the drilled hole using an automated press.

In an alternative embodiment, the embedded portion may be a screw which may be screwed into a screw hole formed in the frame. In such an embodiment, the alignment feature may be removed, if desired, after un-stacking the modules. Other means may also be used for attaching the alignment feature to the module frame.

The protruding portion 806 is preferably tall enough to engage the adjacent frame that is stacked on top of it. Preferably, the protruding portion is also short enough so that chance of breakage from a side force is low and so that the protruding feature does not interfere with movement of the solar module. In addition, the protruding portion is preferably sufficiently short so as to avoid undesirable shading of the photovoltaic module during operation.

Figure 9:
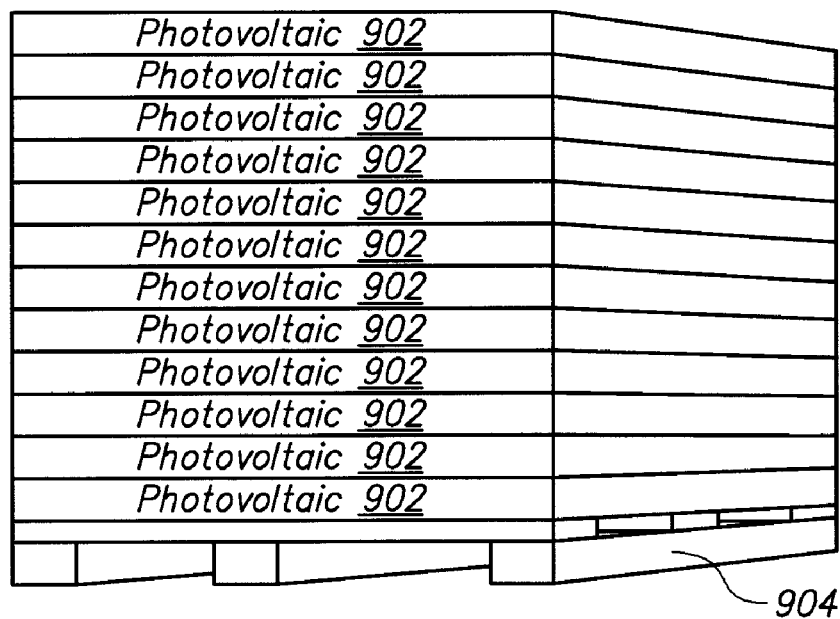
FIG. 9 depicts stack of photovoltaic modules which are interlocked with each other in accordance with an embodiment of the invention.

FIG. 9 depicts stack of photovoltaic modules 902 which are interlocked with each other in accordance with an embodiment of the invention. Advantageously, the photovoltaic modules 902 may be stacked directly on each other and held together, in part, using the male and female alignment features to interlock adjacent modules. The interlocked stack of modules 902 may be strapped to a wood pallet 904 and shipped together as a unit. Protective cardboard sheets may be used on the outside of the stack, but cardboard boxes are not used to hold the modules.

Such an interlocked stack of solar modules is efficient because it provides for dense packing of the modules during transportation. This enables a greater number of modules to be shipped in a same volumetric space compared to prior packaging techniques. The wasted space taken by the cardboard boxes, or created by the corner elements, is avoided.

In addition, the material cost is reduced as neither cardboard boxes nor corner elements are needed as in the prior packaging techniques. Labor is also reduced as the modules need not be unpacked from the boxes, and the boxes or corner elements need not be discarded, recycled, or shipped.

Figure 10:
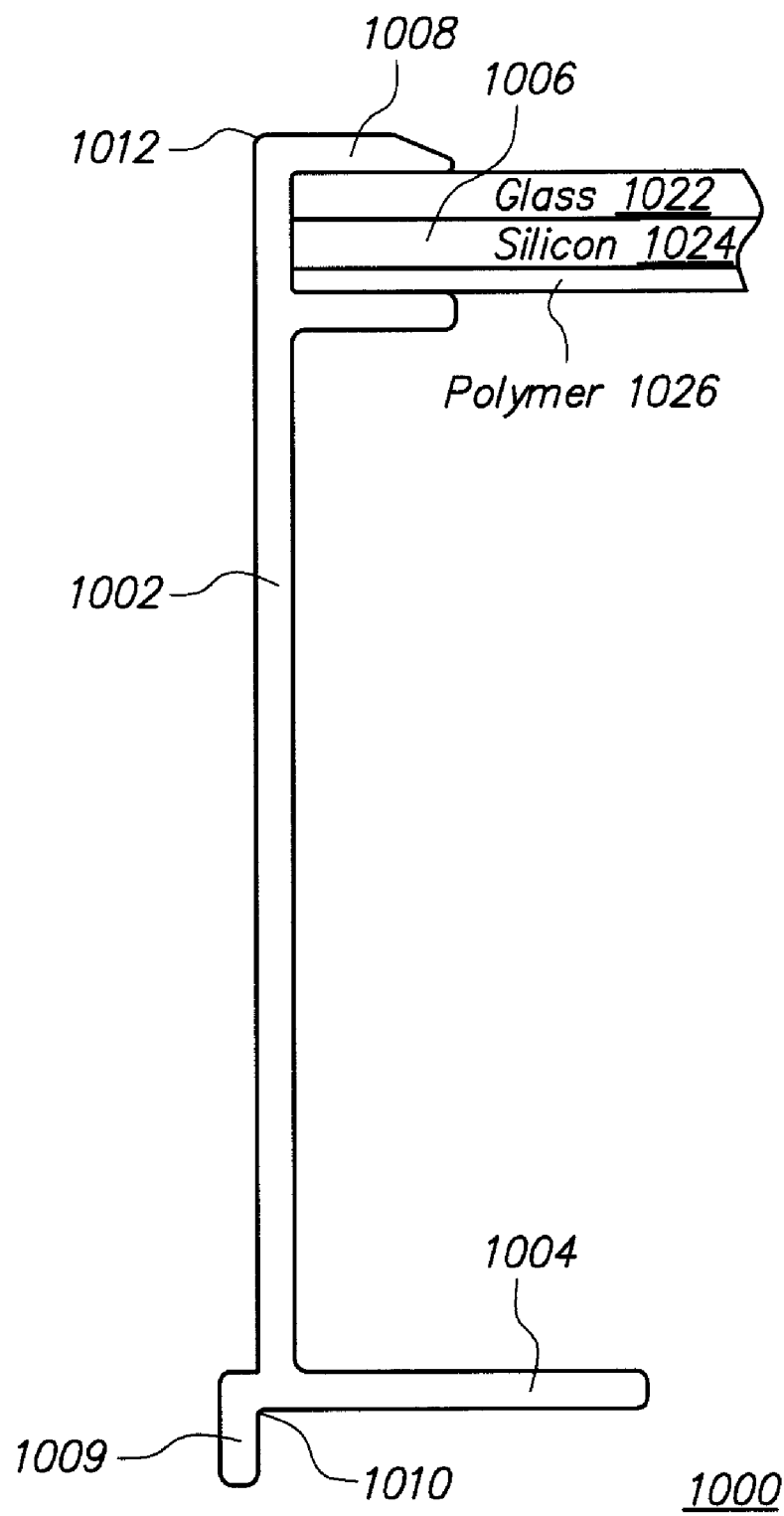
FIG. 10 shows a profile of a module frame in an alternate embodiment of the invention.

FIG. 10 shows a profile of a module frame in an alternate embodiment of the invention. As shown, the frame includes a side member 1002 which attaches to and separates a top member 1008 and a bottom member 1004. A slot 1006 towards the top of the frame is configured to hold and support the photovoltaic cells within the frame. The photovoltaic cells form a silicon layer 1024 which may be sandwiched between a glass layer 1022 and a polymer layer 1026

In accordance with an embodiment of the invention, a lip 1009 is included at the outer edge of the bottom of the frame. The lip 1009 is configured so as to form inner corners 1010 with the bottom surface of the frame. The inner corners 1010 fit onto and interlock with the outer corners 1012 at the top of the adjacent frame in the stack. The outer corners 1012 are formed by the side member 1002 and a top surface of the frame.

While specific embodiments of the present invention have been provided, it is to be understood that these embodiments are for illustration purposes and not limiting. Many additional embodiments will be apparent to persons of ordinary skill in the art reading this disclosure.

For example, an alternate embodiment may provide a female alignment feature on the top surface of a frame, and a corresponding male alignment feature on the bottom surface of the frame. Such features would also enable advantageous direct stacking of the photovoltaic modules for transportation.

What is claimed is:

1. An arrangement of photovoltaic modules, the arrangement comprising:
    a plurality of photovoltaic modules,
    each said photovoltaic module including a frame having at least a top member and a bottom member, wherein the top member is disposed over a portion of a top surface and a perpendicular side surface of a glass layer of the photovoltaic module;
    a plurality of male alignment features disposed over the top member and protruding from the top member of each frame perpendicular to a main longitudinal axis of the glass, wherein the male alignment features securely attach to the top member upon being pressed into holes in the top member; and
    a plurality of female alignment features on the bottom member of each frame comprising a hole in the bottom member of the frame,
    wherein adjacent photovoltaic modules are configured to be unlocked by the male alignment features protruding from the top member of a lower module fitting together with the female alignment features on the bottom member of an upper module.

2. The arrangement of photovoltaic modules according to claim 1, wherein at least one of the female alignment features comprises a drain hole in the bottom member of the frame.

3. The arrangement of photovoltaic modules according to claim 1, further comprising a pallet to which the interlocked plurality of photovoltaic modules is strapped.

4. The arrangement of photovoltaic modules according to claim 1, wherein the photovoltaic modules are stacked directly on top of each other without substantial space in between the adjacent photovoltaic modules.

5. The arrangement of photovoltaic modules according to claim 1, wherein each frame supports a plurality of silicon wafers covered on top by the glass layer and with a polymer layer underneath.

6. The arrangement of photovoltaic modules according to claim 5, wherein the male alignment features on the top member are secured to the top member without passing through a plane of the glass layer.

7. A photovoltaic module comprising:
    an array of solar cells; and
    a frame for supporting the array of solar cells, the frame including a top member and a bottom member connected by a side member, wherein the top member is disposed over a portion of a top surface and a perpendicular side surface of a layer covering the array of solar cells;
    a plurality of male alignment features disposed over the top member and protruding from the top member perpendicular to a main longitudinal axis of the glass, wherein the male alignment features are one selected from the group consisting of self-clinching male alignment features that securely attach to the top member upon being pressed into holes in the top member and male alignment features that securely attach to the top member upon being screwed into screw holes in the top member; and
    a plurality of female alignment features on the bottom member comprising holes in the bottom member of the frame which are configured to interlock with the male alignment features protruding from the top member of another module.

8. The photovoltaic module according to claim 7, wherein at least one of the female alignment features comprises a drain hole in the bottom member of the frame.

9. The photovoltaic module according to claim 7, wherein the array of solar cells comprises a plurality of silicon wafers covered on top by a glass layer and with a polymer layer underneath, and further wherein the male alignment features are secured to the top member without passing through a plane of the glass layer.

10. An arrangement of photovoltaic modules, the arrangement comprising:
    a plurality of photovoltaic modules, each said photovoltaic module including a frame having at least a top member and a bottom member, wherein the top member is disposed over a portion of a top surface and a perpendicular side surface of a glass layer of the photovoltaic module;
    a plurality of male alignment features disposed over the top member and protruding from the top member of each frame perpendicular to a main longitudinal axis of the glass, wherein the male alignment features are securely attached to the top member upon being screwed into screw holes in the top member; and a plurality of female alignment features on the bottom member of each frame comprising a hole in the bottom member of the frame, wherein adjacent photovoltaic modules are configured to be interlocked by the male alignment features protruding from the top member of a lower module fitting together with the female alignment features on the bottom member of an upper module.

11. The arrangement of photovoltaic modules according to claim 10, wherein at least one of the female alignment features comprises a drain hole in the bottom member of the frame.

12. The arrangement of photovoltaic modules according to claim 10, further comprising a pallet to which the interlocked plurality of photovoltaic modules is strapped.

13. The arrangement of photovoltaic modules according to claim 10, wherein the photovoltaic modules are stacked directly on top of each other without substantial space in between the adjacent photovoltaic modules.

14. The arrangement of photovoltaic modules according to claim 10, wherein each frame supports a plurality of silicon wafers covered on top by the glass layer and with a polymer layer underneath.

15. The arrangement of photovoltaic modules according to claim 14, wherein the male alignment features on the top member are secured to the top member without passing through a plane of the glass layer.

* * * * *

UNITED STATES PATENT AND TRADEMARK OFFICE
CERTIFICATE OF CORRECTION

| | | |
|---|---|---|
| PATENT NO. | : 8,258,395 B2 | Page 1 of 1 |
| APPLICATION NO. | : 12/392076 | |
| DATED | : September 4, 2012 | |
| INVENTOR(S) | : Brian S. Wares | |

It is certified that error appears in the above-identified patent and that said Letters Patent is hereby corrected as shown below:

on column 6, line 5, after "be", replace "unterlocked" with

-- interlocked --

Signed and Sealed this
Sixth Day of November, 2012

David J. Kappos
*Director of the United States Patent and Trademark Office*